United States Patent [19]

Carroll

[11] Patent Number: 4,467,193

[45] Date of Patent: Aug. 21, 1984

[54] PARABOLIC LIGHT EMITTER AND DETECTOR UNIT

[75] Inventor: Arthur B. Carroll, St. Joseph, Ill.

[73] Assignee: Carroll Manufacturing Corporation, Champaign, Ill.

[21] Appl. No.: 302,201

[22] Filed: Sep. 14, 1981

[51] Int. Cl.³ .............................................. H01J 39/12
[52] U.S. Cl. ..................................... 250/216; 362/800; 313/500
[58] Field of Search ................ 350/293, 292, 294, 296; 250/216, 221; 313/500; 362/800

[56] References Cited

U.S. PATENT DOCUMENTS

| 2,855,523 | 10/1958 | Berger | 250/216 |
|---|---|---|---|
| 3,821,590 | 6/1974 | Kosman et al. | 362/800 |
| 3,856,127 | 12/1974 | Halfon et al. | 250/221 |
| 3,944,815 | 3/1976 | Beckmann et al. | 250/216 |
| 4,050,444 | 9/1977 | Dolamore | 350/293 |
| 4,143,394 | 3/1979 | Schöberl | 313/500 |
| 4,267,443 | 5/1981 | Carroll et al. | 250/221 |
| 4,267,486 | 5/1981 | Thillays | 313/500 |
| 4,310,756 | 1/1982 | Sick et al. | 250/221 |
| 4,320,442 | 3/1980 | McCamy | 350/293 |
| 4,387,367 | 6/1983 | Fisher | 250/221 |

FOREIGN PATENT DOCUMENTS 266495  4/1964  Australia ............................. 350/296

Primary Examiner—David C. Nelms
Assistant Examiner—J. Brophy
Attorney, Agent, or Firm—Hill, Van Santen, Steadman & Simpson

[57] ABSTRACT

A parabolic light emitter incorporates a solid state light emitter embedded in a transparent body formed with one planar surface and an opposing surface formed as a paraboloid, the outer surface of which is coated with a light reflecting material. In one embodiment, a reflective member is interposed between the light emitter and the planar surface.

7 Claims, 7 Drawing Figures

U.S. Patent     Aug. 21, 1984     4,467,193
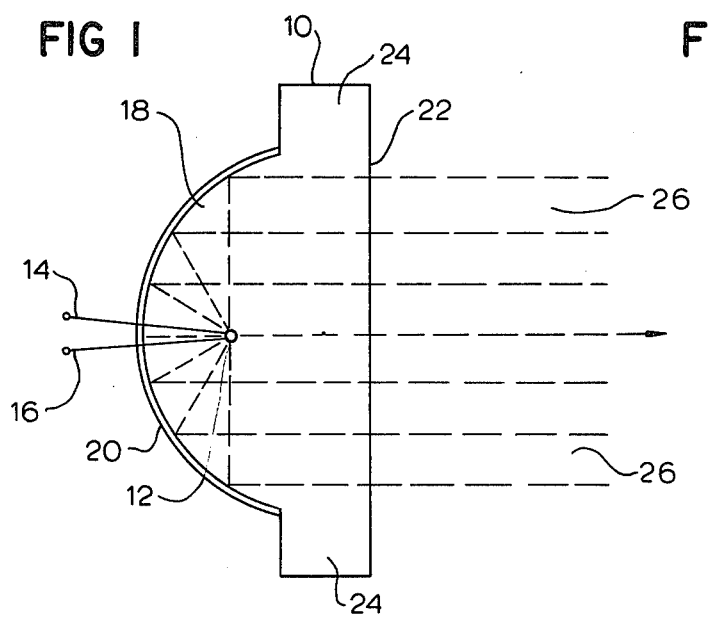
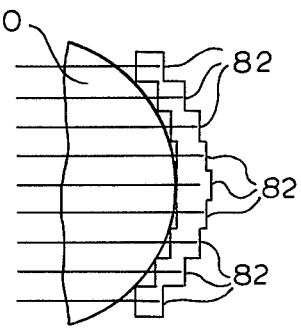
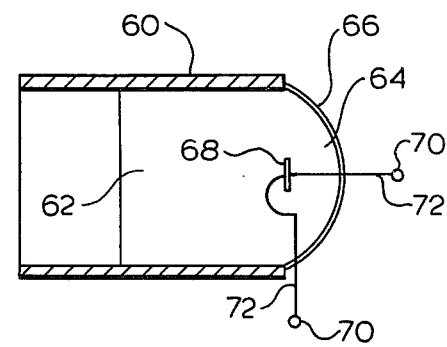
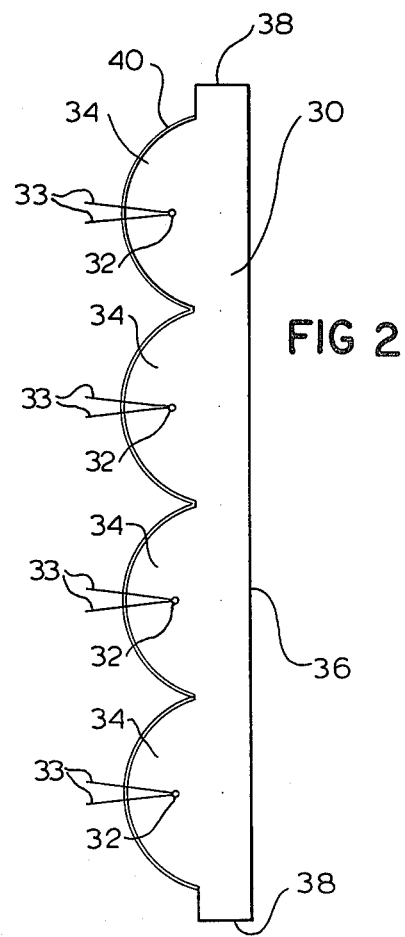
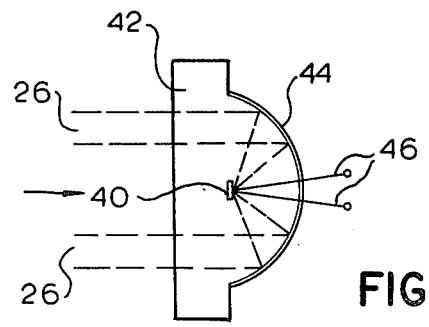
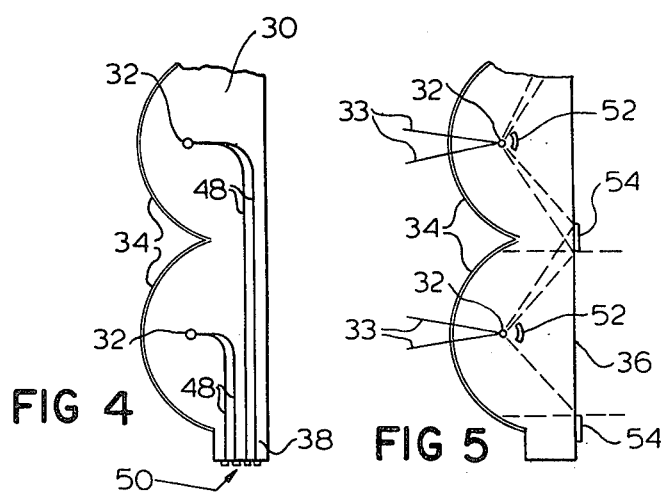

PARABOLIC LIGHT EMITTER AND DETECTOR UNIT

BACKGROUND OF THE INVENTION

1. Field of the Invention

The present invention relates to touch input devices of the type used to enter data into a data processing system by intersecting at least one of a plurality of light beams with a finger or stylus, and more particularly to light emitters used in connection with such apparatus.

2. The Prior Art

A variety of types of touch input devices are known, and in one commerically available type of such units, a number of light beams is provided spaced slightly in front of a CRT so that at least one light beam is broken when a particular position on the face of the CRT is indicated as being touched with a finger or stylus. Each of the light beams begins with a light emitting source such as a LED, and a light responsive device such as a phototransistor is located at the other end of the beam. Interruption of the beam produces a signal at the output of the photoresponsive device associated with the interrupted beam, and this output can furnish time and position information with respect to the touch input.

Because, under ideal conditions, each light beam is initiated from one source and is terminated in one receptor, it is normally necessary to provide means for collimating the light along the desired path, and to prevent it from spreading to other photosensitive devices, to prevent the occurrence of interruption signals from photosensitive devices not directly associated with an interrupted beam. Typically the means for doing this has comprised aligned aperatures, or focusing lenses, or both. Other techniques involved gating the photoresponsive device into operation one at a time, so that at any given time only one LED and one phototransistor is operative, making collimation unnecessary. Still other techniques involved the gating of the photoresponsive in groups, the groups being so arranged that all of the devices but one in a group are relatively remote from the beam of the operating LED.

While the techniques of the prior art have met with considerable success, they introduce either complexity in terms of additional electronic circuitry, or relatively low efficiency in utilization of the light produced by the LEDs. For example, when a lens system is employed for collimating the light into a beam, only the light rays within the solid angle intersected by the operative portion of the lens is guided along the desired beam path. Light rays in other angles are scattered or absorbed, and do not form a useful contribution to the energy of the light beam. In addition, the lens reflects a portion of the incident light at each surface, and this reflected light is also lost.

In addition, when collimating or lens systems are used, extreme care is necessary in orienting the position and attitude of the parts. When a lens system is used incorporating lenses physically separate from the light emitters, they must be positioned accurately so that the light emitter is at the focal point of the converging lens. Also the lens must be accurately located coaxially with the desired path of the light beam. Even when an LED structure is used which incorporates a transparent housing with a curved surface approximating a converging lens, the unit must be located accurately relative to the desired path of the light beam.

SUMMARY OF THE INVENTION

It is the principal object of the present invention to provide an apparatus for producing a narrow beam of light without incorporating lenses or apertures.

Another object of the present invention is to provide a light source for touch input devices which exhibits a greater efficiency in the utilization of light produced by the light emitter.

Another object of the present invention is to provide an arrangement for producing a light beam of a much greater proportion of the total amount of light emitted by a light emitter, without increasing the sensitivity of positioning of the parts which go into the system.

These and other objects of the present invention will become manifest by an examination of the accompanying drawings and the following description.

DESCRIPTION OF THE DRAWINGS

Reference will now be made to the accompanying drawings in which:

FIG. 1 illustrates a light emitter incorporating an illustrative embodiment of the present invention;

FIG. 2 is an illustration of a modified embodiment of the present invention; and FIGS. 3-7 are illustrations of further embodiments of the present invention.

DESCRIPTION OF THE PREFERRED EMBODIMENTS

Referring now to FIG. 1, a cross sectional view of the first embodiment of the present invention is illustrated. The arrangement comprises a body of clear plastic material 10, in which is embedded an LED 12. A pair of leads are connected from the LED 12 to a pair of terminals 14 and 16, by which an external source of power may be connected to the LED, to cause it to emit light.

The plastic body 10 is formed at its rear surface 18 in the shape of a paraboloid, i.e., the surface of revolution generated by rotating a parabola about its axis of symmetry, and a coating 20 of light reflecting material such as aluminum is coated onto the exterior surface of the part 18. The forward part of the body 10 comprises a plane surface 22, and directly behind the plane surface 22 is a projecting flange 24, by which the unit may be mounted by brackets (not shown).

When the LED 12 is energized, it generates light through a solid angle extending through approximately a hemisphere, and this light is directed backwardly toward the part 18. Substantially all of the light is reflected from the reflecting surface 20, and forms a parallel beam 26. The beam 26 is indicated in FIG. 1 by a plurality of dashed lines, indicating individual rays emitted from the LED 12.

The LED 12 is located at the focal point of the parabolic surface 18, so that all of the rays in the beam 26 are parallel to each other, and normal to the front surface 22.

The aluminized reflective coating 20 which is coated onto tthe rear surface of unit 10 reflects substantially all of the light generated by the LED 12 and impinging on the rear surface. Only a small fraction of the light is absorbed by the surface, and the combination of the good reflecting properties, and the fact that the reflecting parabolic surface extends over a considerable solid angle, contributes to the utilization of a large proportion of the light generated by the LED 12. Some of the light reflected from the surface 20 is shaded by the physical parts of the LED itself, but the amount of the beam 26 interrupted because of the shading is a small fraction of the total beam.

The flange 24 provides a convenient mechanism for mounting the unit 10, and because the front face 22 is planar, the attitude of the unit 10 is readily controlled simply by positioning the face 22 against rigid stops, or against a wall having an aperture aligned with and passing beam 26. Because the front surface 22 is planar, and transverse to the direction of the beam 26, minor errors in positioning of the unit 10 in a direction transverse to the beam 26 does not introduce an angular error into the beam. This avoids any difficulty in attitude control which would accompany a system having a convex front face, so that lateral misadjustment relative to a member engaging the front face would result in an angular error of the beam.

In the system of the present invention, the internal reflection from the surface 20 is highly efficient, and the angle of incidence of the beam 26 on the plane front surface 22 is transverse to this plane. At this attitude, internal reflection from the surface 22 is at a minimum, so that the maximum allowed amount of light is passed into the beam 26 outside of the unit 10.

The aluminum coating 20 may be deposited on the exterior surface of the part 18 by any convenient means such as by sputtering, vapor deposition, or the like. In addition, although aluminum is a preferred material for the reflecting layer because it is easy to apply and relatively inexpensive, it is also possible to use other materials for the reflecting layer such as silver, gold, or other noble metals. In any case, the surface 20 remains parabolic, so that the rays are reflected into a coherent parallel beam 26.

FIG. 2 illustrates an alternative embodiment of the present invention. There a transparent member 30 incorporates four LEDs 32 oriented at the focal point of four paraboloids 34. The LEDs 32 are located at the foci of the paraboloids, so that each produces a parallel beam in the direction normal to the front surface 36 of the member 30. Flanges 38 at the ends of the member 30 allow for support of the unit 30 in a bracket or like not shown. When mounted, the unit 30 is oriented in a direction so that the surface 36 is normal to the direction desired for the beams, and the four beams are parallel to each other and transverse to the plane 36.

Each of the LEDs 32 has a pair of leads 33 extending out through the rear of the paraboloids 34, so they may be connected to a suitable energizing source. The outside surface 40 of the paraboloids is covered with a reflective material such as aluminum or the like, as described above.

Although only four light emitters are shown in the apparatus of FIG. 2, it will be obvious that any number of them can be associated together in a single unit, by which a number of parallel light beams may be efficiently produced.

If desired, the leads to the LEDs may extend through the body of the unit 32 and exit through one of the projections 38, as shown in FIG. 4. There, the leads 48 extend to the lower projection 38 and are connected with conductive contact members 50 on the exterior surface. The contact members 50 are adapted to engage corresponding contact members in a socket (not shown) so that electrical connections to the LEDs are automatically established upon insertion into the socket. The leads 48 are arranged to overlie each other in the beam direction so obstruction of the beam is minimized.

The arrangement shown in FIG. 5 has opaque members 52 positioned directly in front of the LEDs 32, to intercept light which is not reflected from the parabolic reflecting surface. Preferably the members 52 have a concave spherical surface facing the LED so that the intercepted light is reflected back to the parabolic surface, and adds to the intensity of the beam. Additional opaque members 54, formed of material which absorbs rather than reflects light, are provided in the surface 36 to absorb stray light which is not intercepted by the members 52, as shown by the dashed lines in FIG. 5. Stray light having a greater divergence from the beam path than shown by the dashed lines is fully reflected by the surface 36, and emerges, if at all, in weakened and scattered condition, so that it represents a relatively low noise level when detected by various photo detectors.

In the apparatus of the present invention, the LED is placed at or near the focal point of the parabolic surface. If the position of the LED is offset slightly from the exact focal point of the paraboloid, an angular error in the beam results, which is inversely proportional to the distance between the LED and the rear surface of the paraboloid. For manufacturing processes which allow the LED to be positioned accurately at the focal points, the LEDs may be located quite close to the rear surface of the paraboloids, with a result that a light beam may be produced which is very narrow across its width, or alternatively, a wider beam may be produced which incorporates an even greater proportion of the light generated by the LED. On the other hand, when a manufacturing process is used which does not admit of great accuracy in the placement of the LEDs, the sensitivity of placement may be lessened by incorporating a shallower parabola so that the LED is positioned a relatively greater distance away from the rear surface. This results in a beam which is either wider, or slightly dimmer owing to the utilization of a lower percentage of light generated by the LED, so that the maximum angular error of the beams produced can be kept under control. By manipulation of these variables, the present invention allows a means of providing a plurality of parallel beams in a single component, with beams which are substantially parallel to each other and do not exceed a given limited angular error. Thus it is possible to produce the apparatus of the present invention rapidly and economically, when close tolerances are not required for the positioning of the LED at the focal point of the parabaloid, and still maintain parallelism of the beams.

Although the apparatus of FIGS. 1 and 2 has been described especially in connection with light emitters, it is apparent that the principals of the present invention can also be applied to light responsive devices such as photodiodes or the like. In such a case, the LEDs are replaced by photodiodes, and receive light from a beam which is intercepted and reflected from the parabolic reflecting surface. In this way, a relatively small light receptor is produced, which is responsive to substantially all of the light in a parallel beam such as the beam 26, without requiring any lens in front of the photoresponsive device.

Such a unit is shown in FIG. 3, where a photodiode 40 is embedded in a transparent plastic housing 42. A reflective coating 44 covers the exterior of the parabolic surface, just as in FIG. 1. The electrical leads 46 are brought out through the rear of the unit, just as illustrated in FIGS. 1 and 2. The advantages of ease of mounting and orientation, and the relative insensitivity to tolerances in the positioning of the photoresponsive device at the focal point of the paraboloid, are the same as those pointed out in connection with FIGS. 1 and 2.

The method of making the apparatus of FIGS. 1-5 is substantially the same as that currently employed in connection with LEDs which have transparent housings with convex surfaces, and need not be described since they are familiar to those skilled in the art. The plastic material of which the housing is formed may be any transparent plastic material, but is preferably a thermoplastic material so that the photoemitter or photoresponsive devices may be easily molded in place, supported in position by the leads. The members 52 are preferably attached to the LEDs 32, by transparent material, before the LEDs are molded in place, so that their positions relative to their respective LEDs is fixed.

FIG. 6 shows an embodiment of the present invention having an opaque tube 60 formed of metal or the like, in which a transparent body 62 is supported. The body 62 is formed of transparent plastic or the like, and has a parabolic surface 64 at one end of the tube 60, coated with a reflective layer 66. The light emitting diode 68 is positioned at the focus of the parabolic surface, embedded within the body 62, and is connected to exterior terminals 70 by wires 72. The front surface of the body 62 is preferably planar, to reflect a minimum of light from the diode 68, and to provide minimum defraction of light from the diode. The other end of the tube 60 may be extended as long as desired beyond the front surface of the body 62, to shade the body 62 from ambient or stray radiation, which, in reflecting from the front surface of the body 62 may produce unwanted results.

All of the embodiments of FIGS. 1-6 may be used with photosensitive devices, instead of light emitters, and in such event, the LED is replaced at the same position with a phototransistor, photodiode or the like. When the embodiment of FIG. 6 is used for a photosensitive device, the tube 60 tends to shield the photosensitive element from ambient or stray radiation, which may otherwise reach and activate the photosensitive element. When the tube 60 is formed of metal and connected to a reference potential or sink, it provides electrostatic shielding for the active element.

When the parabolic devices described herein are used in groups, as in a touch input device where two groups form beams of radiation along orthogonal axes, the straight line arrangements shown in FIGS. 2, 4 and 5 are preferred when there are rectangular sides to the touch input area. When the operative area is circular, however, as when used with a conventional cathode ray tube, it is preferable to connect the individual units in such a way that the units form a circumferential line concentric with the CRT screen, or to mold the member 30 in the form of a circular arc. The individual parabolic unis are preferably oriented within the curved member so that the radiation beams are parallel and equally spaced apart, which is accomplished by spacing the units further apart at the extremities of the arc than at the center. FIG. 7 illustrates such a body, formed in an arc concentric with a CRT 80, and having nine active units, each with a parabolic reflective surface 82. Again, the units may be either photoemitters or photodetectors. The arrangement of FIG. 7 has an inner plane surface normal to the beam direction for each unit. Alternatively, the surface of the member 30 is formed of a plurality of planes each tangential to a circular arc concentric with the CRT. In this event, the orientation of the active units must be non-parallel, so that they cooperate with parallel beams, allowing for defraction at the inner surfaces.

Although the foregoing description is in terms of devices used with touch input systems, it is apparent that they may be used in any situation in which a radiation beam is to be produced and monitored.

It will be apparent that various modifications and additions may be made in the apparatus of the present invention without departing from the essential features of novelty thereof which are intended to be defined and secured in the appended claims.

What is claimed is:

1. In a touch input device having a plurality of beams of light generated from individual light surfaces, and a plurality of photosensitive devices for responding to said beams, the combination comprising an elongated body of transparent material, a plurality of optoelectrical devices embedded in said material, said body having an external surface in the form of a plurality of paraboloids, said paraboloids being aligned with their axes of symmetry in parallel, each of said paraboloids being aligned with one of the optoelectrical devices, a reflective coating on the exterior of each of said parabolic surfaces, and said body having a plane surface located on the opposite side of said optoelectrical devices from at least one of said paraboloid surfaces.

2. Apparatus according to claim 1, wherein each of said optoelectrical devices has at least one electrical lead passing through its reflective surface.

3. Apparatus according to claim 1, wherein each of said optoelectrical devices has two electrical leads connected with it, all of said leads passing out through a side of said body adjacent said plane surface.

4. Apparatus according to claim 1, wherein said plane surface is a single surface located on said opposite side of all of said optoelectrical devices.

5. Apparatus according to claim 1, wherein said beams are oriented in a plane, and said body is curved about an arc in the plane of said beams.

6. Apparatus according to claim 5, wherein a plurality of plane surfaces are provided, one for different ones of said optoelectrical devices along said arc.

7. Apparatus according to claim 6, wherein said plurality of plane surfaces are all normal to their respective beams.

* * * * *